United States Patent [19]
Saitoh et al.

[11] Patent Number: 5,442,195
[45] Date of Patent: Aug. 15, 1995

[54] SUPERCONDUCTING DEVICE INCLUDING PLURAL SUPERCONDUCTING ELECTRODES FORMED ON A NORMAL CONDUCTOR

[75] Inventors: Kazuo Saitoh, Hachiouji; Toshikazu Nishino, Kawasaki; Mutsuko Hatano, Kodaira, all of Japan

[73] Assignee: Hitachi, Ltd., Tokyo, Japan

[21] Appl. No.: 136,984

[22] Filed: Oct. 18, 1993

Related U.S. Application Data

[63] Continuation of Ser. No. 817,668, Jan. 7, 1992, abandoned.

[30] Foreign Application Priority Data

Jan. 11, 1991 [JP] Japan ................... 3-001911

[51] Int. Cl.$^6$ .............. H01L 39/22; B05D 5/12; H01B 12/00; G11C 11/44
[52] U.S. Cl. ..................... 257/36; 257/34; 257/39; 505/191; 505/170; 505/237; 505/832; 427/62; 365/162
[58] Field of Search ............ 357/5; 505/1, 700, 701, 505/702, 831–835, 874, 873, 190–193, 234–239, 170; 257/33, 34–39; 427/62, 63; 365/162

[56] References Cited

U.S. PATENT DOCUMENTS

| | | | |
|---|---|---|---|
| 5,019,721 | 5/1991 | Martens et al. | 257/34 |
| 5,071,832 | 12/1991 | Iwamatsu | 505/1 |
| 5,075,736 | 12/1991 | Wada | 357/5 |
| 5,101,243 | 3/1992 | Chi et al. | 357/5 |

FOREIGN PATENT DOCUMENTS

| | | | |
|---|---|---|---|
| 58-61664 | 4/1983 | Japan | 505/874 |
| 60-254492 | 12/1985 | Japan | 505/832 |
| 61-206278 | 9/1986 | Japan | 357/5 |
| 63-291464 | 11/1988 | Japan | 257/39 |
| 1-132178 | 5/1989 | Japan | 357/5 |
| 1-145878 | 6/1989 | Japan | 357/5 |
| 1-300575 | 12/1989 | Japan | 357/5 |
| 232571 | 2/1990 | Japan | 357/5 |
| 3-228381 | 10/1991 | Japan | 357/5 |

OTHER PUBLICATIONS

Murakami et al, "New Devices Using Superconducting Ba pb Bi O (BPB) Thin Films," Citation Unknown.
Ito et al, "Hysteresis Loop in Current–Voltage Curve For Ba–pb–Bi–O Josephson Junction Array in a Microwave Field," Jap. J. Appl. Phys., vol. 21, #6, Jun. 1982, pp. L375-L376.
Kawakami et al. "Single Crystal InAs Coupled Josephson Junction," Appl. Phys. Lett., vol. 46, #1, 1 Jan. 1985, pp. 92–94.
Harada et al, "Artificial Neural Network Circuits With Josephson Junction Devices", Transactions on Magnetics (IEEE), vol. 27, #2, Mar. 1991, pp. 2863–2866.
S. M. Faris et al., "Quiteron", IEEE Transactions on Magnetics, vol. MAG-19, No. 3, May 1983, pp. 1293–1295.
Richard F. Voss et al., "Phase Coherence in a Weakly Coupled Array of 20 000 Nb Josephson Junctions", Physical Review B, vol. 25, No. 5, Mar. 1982, pp. 3446–3449.

Primary Examiner—Mahshid D. Saadat
Attorney, Agent, or Firm—Kenyon & Kenyon

[57] ABSTRACT

A superconducting device may include a superconducting weak link equipped with plural superconducting devices that are used as input-output terminals formed on the same plane and at least one current source for applying current to at least one of these superconducting electrodes. A superconducting device suitable for high integration can be realized as it enables structuring of a superconducting weak link 1 equipped with plural superconducting electrodes 101, 102, 103 and 104 that can be used as input-output terminals and changing symmetry of superconducting electrode arrangement through the form of a normal conductor 201 which is forming a superconducting weak link. In addition, when this superconducting device is used as a quasi-particle injection type device, a superconducting device with plural superconducting electrodes that can be used for a gate electrode, drain electrode or control electrode can be realized. Further, a superconducting device equipped with new functions (e.g. motion as a neuron device) which are capable of high integration can be realized by utilizing these characteristics. Furthermore, being a proximity effect type, superconducting weak link has an advantage of realizing an ultra highspeed, low electricity consuming switching device.

6 Claims, 8 Drawing Sheets

SUPERCONDUCTING DEVICE INCLUDING PLURAL SUPERCONDUCTING ELECTRODES FORMED ON A NORMAL CONDUCTOR

This application is a continuation of application Ser. No. 07/817,668, filed on Jan. 7, 1992, now abandoned.

BACKGROUND OF THE INVENTION

The present invention concerns a high-speed and low electricity consumption superconducting device comprised of plural superconducting weak links, which, in turn, are made up of plural superconducting electrodes and include plural input-output terminals.

A quasi-particle injecting type superconducting transistor (Quitecron) has previously been known as a superconducting device comprised of a Josephson junction including plural superconducting electrodes. This superconducting device is disclosed, for instance, in IEEE Transaction on Magnetics, 1983, Vol. MAG-19, No.3, pp. 1293–1295. As shown in FIG. 1 (a), for instance, this conventional technology is comprised of a quasi-particle injecting electrode which is connected to a double-stacked Josephson tunnel junction.

In addition, a two-dimensional superconducting junction comprised of a superconducting weak link including plural superconducting electrodes is disclosed, for instance, in Physical Review B, 1982, Vol. 25, No.5, pp. 3446–3449. In this conventional technology, as shown in FIG. 1 (a), for instance, a superconducting junction array is comprised of superconducting weak link equipped with 4 terminals using niobium/niobic acid/-niobium.

SUMMARY OF THE INVENTION

Among conventional technology, problems with regard to Quiteron occur in that it has a complex device preparation process as it uses a double-stacked Josephson tunnel junction and that its device layout becomes complex at the time of integrating because a quasi-particle injecting electrode is clearly divided from source and drain electrode owing to their shape. Further, problems such as a complex device preparation process owing to formation of superconducting weak link in stacks and that the number of superconducting electrodes that are used as input-output terminals cannot be increased at a two-dimensional superconducting junction have been revealed.

The present invention provides a superconducting device with a new operating principle, and is equipped with ultra high speed, low electricity consumption and high current gain.

The superconducting device according to the present invention is comprised by including a superconducting weak link equipped with plural superconducting electrodes which are used as an input-output terminal formed on the same plane, and at least one power source for applying electric current which is lead to at least one of the foregoing plural superconducting electrodes.

In the superconducting device of the present invention, electric current is applied to at least one of the plural superconducting electrodes. The superconducting weak link used for the superconducting device in the present invention is a superconducting weak link based on the principle of a superconducting proximity effect which is generated when a superconductor and a normal conductor come in contact with one another. A device with planar structure which is suited for integration can be realized by using this superconducting weak link.

In the superconducting device of the present invention, plural superconductors are formed on the same plane by facing each other or by adjoining each other with normal conductors in between. Accordingly, a planar type superconducting weak link is formed which is equipped with plural input-output terminals and has plural paths where superconducting wave functions overlap as a result of superconducting proximity effect. A reasonable value of control current is injected to a certain superconducting electrode while bias current which is the same or lower than the critical current of weak link is put through these superconducting electrodes that are facing each other. Otherwise, voltage is applied to the control electrode when it is used as a field-effect type switching device. Certain superconducting electrodes facing each other can be selectively shifted to a voltage state according to the combination of bias current and control current value, or by choice of superconducting electrode to which control current is applied.

As the device cart be formed into a form possessing rotational symmetry or line-symmetry against the center of weak link on the same plane according to the form of a normal conductor comprising a weak link section in the superconducting device of the present invention, it is possible, for instance, to use each superconducting electrode as a source electrode, drain electrode or gate electrode when using this device as a switching device. As a result, the superconducting device in the present invention is a superconducting device with excellent integrateability that enables simple integration.

Further, since there is more than one link path that forms a superconducting weak link in the superconducting device in the present invention, a superconducting device that has higher controllability and more freedom of control than the conventional superconducting weak link can be realized by controlling the spatial variation in a superconducting wave function, which started permeating on the foregoing normal conductor due to superconducting proximity effect by locally controlling through control current or voltage which is applied from the foregoing superconducting electrode.

DETAILED DESCRIPTION OF THE PREFERRED EMBODIMENTS

Figure 1:
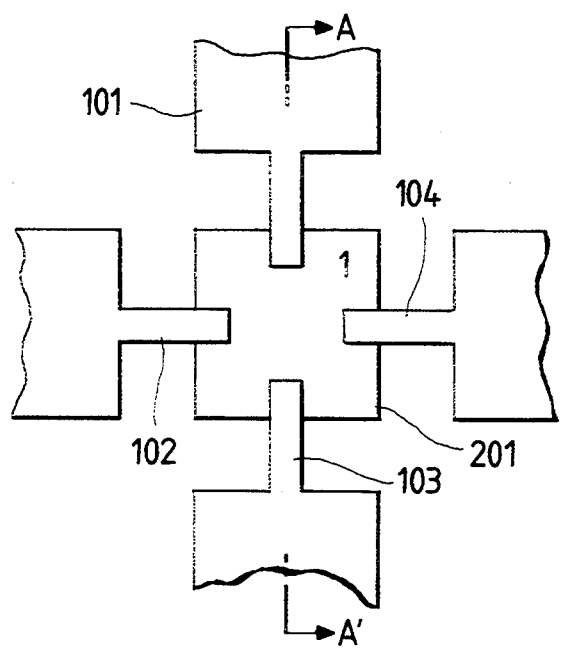
FIG. 1 is a top view of a superconducting device according to the first embodiment in the present invention.
Figure 2:
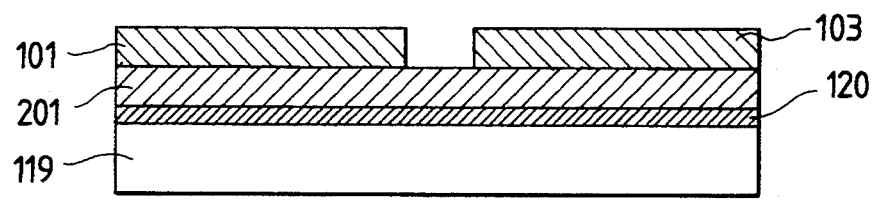
FIG. 2 is a cross section diagram showing cross section A–A' in FIG. 1 according to the first embodiment of the present invention.

The present invention of this application will now be explained in detail. FIG. 1 is a top view of a superconducting device according to the first embodiment of the present invention. FIG. 2 is a cross section diagram showing cross section A-A' in FIG. 1 according to the first embodiment of the present invention. As explained earlier, the superconducting device according to the present invention is a superconducting weak link 1 which is comprised of plural superconducting electrodes 101, 102, 103, 104 which are facing each other, and a normal conductor 201 which is between all of these superconducting electrodes.

First, the basic fabricating process of the superconducting device according to the present invention will be explained through FIG. 2. A $SiO_2$ layer 120 with a thickness of approximately 200 nm was formed on the surface of a substrate 119 made of Si-single crystal according to a heat oxidization method. Then a film with a thickness of 100 nm made of Al was formed through a molecular beam method in high vacuum, followed by forming of superconducting layers 101 and 103 made of superconducting Nb and having a thickness of 100 nm through a molecular beam method in the similar high vacuum. In the foregoing process, the Al layer, which is a normal conducting layer 201, and the Nb layers, which are superconducting electrodes 101 and 103, were formed successively without taking them out in atmosphere. Accordingly, an excellent interface between the normal conductor and superconductor can be obtained which is necessary for fabricating a weak link by using a proximity effect.

A superconducting weak link containing two pairs of superconducting electrodes facing each other can be obtained by processing the double-layer film, which is comprised of the foregoing normal conducting layer 201 and superconducting layers 101 and 103, through a reactive ion etching method, using a resist pattern that was formed through an electron beam direct writing method as a mask. Then, an example of processing size for a weak link is shown. Superconducting electrodes 101, 102, 103, 104 shown in FIG. 1 are 1 μm wide. Further, the interval of a weak link 1 at which superconducting electrodes face each other with a normal conductor in between is 2 μm. These dimensions are mere examples and are not limited to these numbers. The recommended dimensions are 50 to 0.2 μm for the width of each superconducting electrode and 50 to 0.05 μm for the gap at a weak link 6 at which superconducting electrodes face each other with a normal conductor in between. Dimensions that are more desirable would be 2 to 0.5 μm for the width of each superconducting electrode and 0.5 to 0.1 μm for the gap at a weak link 6 at which superconducting electrodes face each other with a normal conductor in between.

Next, the structure of a superconducting device including superconducting electrodes 101, 102, 103, 104, which were formed by using superconductor Nb, and a weak link 1 will be shown by using a top view of a superconducting device according to the first embodiment in the present invention in FIG. 1. A superconducting electrode 101 is installed for injecting bias current while a superconducting electrode 102 is installed for injecting control current. Superconducting electrodes 101 and 103 are linked through a superconducting proximity effect with a normal conductor in between. Moreover, although not shown in FIG. 1, there is a structure in which a superconducting electrode 101 is connected with a direct current bias current source while a superconducting electrode 102 is lead by a control current source. By using the foregoing structure, this device can be used as a 3 terminal-type superconducting device with a superconducting electrode 101 lead by bias current source, a superconducting electrode 102 lead by control current source and a superconducting electrode as input-output terminals.

Figure 3:
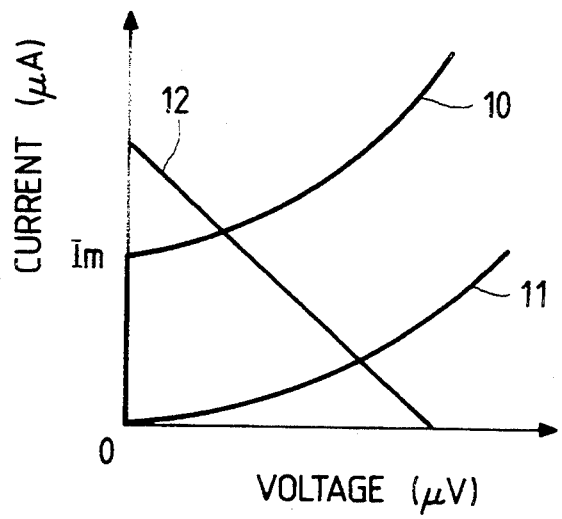
FIG. 3 are current-voltage characteristic curves (10, 11) showing switching trajectory (12) of a superconducting device according to the first embodiment of the present invention.

FIG. 3 indicates current-voltage characteristics curves (10, 11) showing a switching trajectory (12) of a superconducting device according to the first embodiment of the present invention. A characteristic curve 10 in FIG. 3 is a current-voltage characteristic of weak link when control current is not injected. This characteristic is a current-voltage characteristic in which hysteresis does not occur, which is typical in superconducting weak link. A characteristic curve 11 in FIG. 3 is a current-voltage characteristic when control current is applied, and has shifted to a voltage state by application of control current. In addition, a load curve 12 shown in FIG. 3 makes it possible to switch between two states, state 1 and state 2, depending on whether control current is applied or not applied.

Switching between two states was performed by cooling the superconducting device in the present invention by putting it in liquid helium and shifting it to a voltage state manifested in current-voltage characteristic by using control current.

Figure 4:
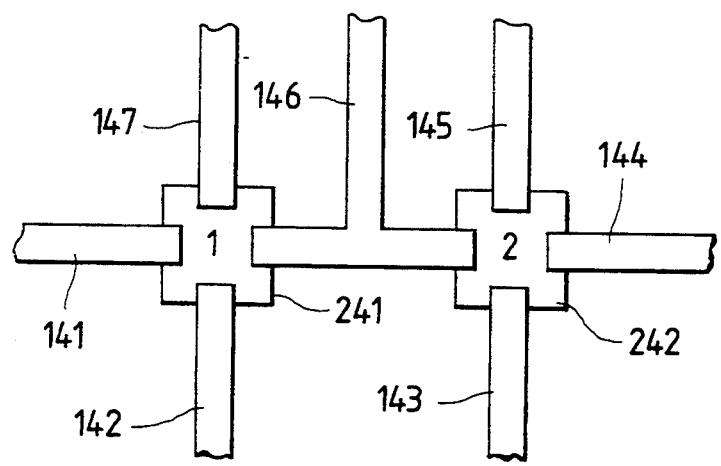
FIG. 4 is a top view of a superconducting device according to the second embodiment in the present invention.

Then, the second embodiment in the present invention will be explained by using FIG. 4. The fabricating process and materials used in the superconducting device of this embodiment can be the same as those in the first embodiment of the present invention. In this embodiment, however, the difference is the point that the two superconducting devices in the foregoing first embodiment are formed by being integrated in series. As explained in the foregoing first embodiment, the integration shown in this embodiment is simple because this device is a planar 3 terminal-structured device. Integrating in this manner will enable parallel processing.

Figure 5:
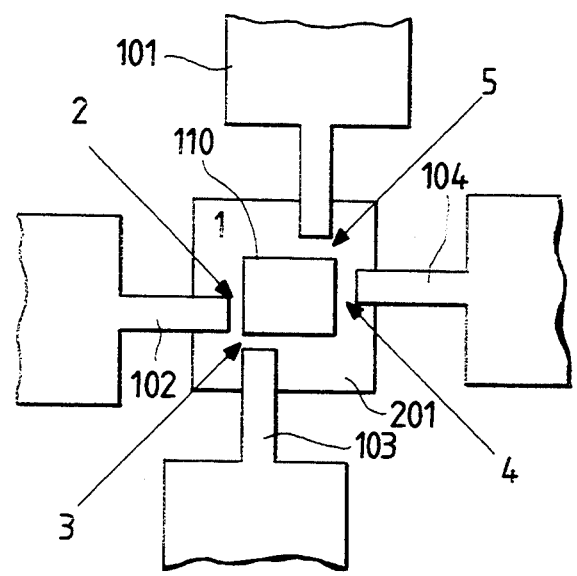
FIG. 5 is a top view of a superconducting device according to the third embodiment of the present invention
Figure 6:
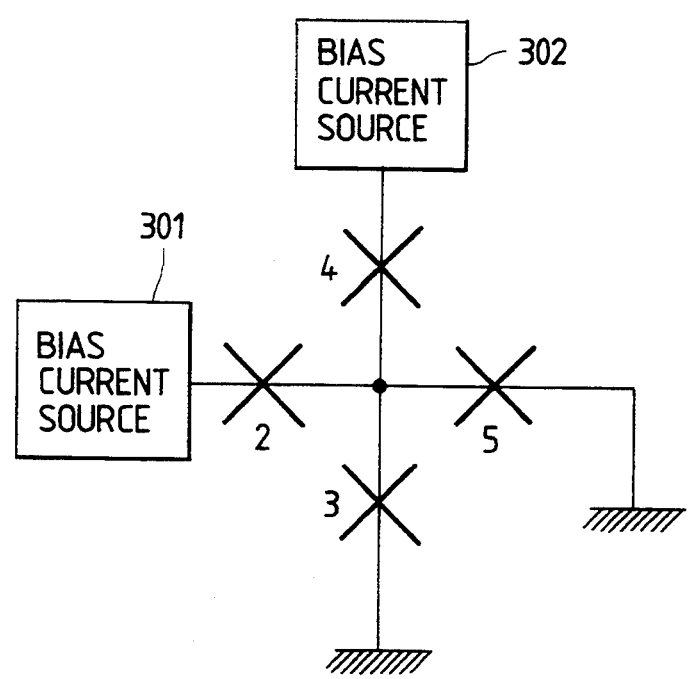
FIG. 6 is equivalent circuit diagram of a superconducting device according to the second embodiment of the present invention.

Next, the third embodiment in the present invention will be explained by using FIG. 5. The fabricating process and materials used in the superconducting device of this embodiment can be same as those in the first embodiment of the present invention. In this embodiment, however, the difference is that a fifth superconductor 110 is formed on top of a normal conductor in addition to superconducting electrodes 101 or 104 at the superconducting weak link. An equivalent circuit diagram of this device is shown in FIG. 6. As shown in this diagram, superconducting electrodes 101 and 102 are lead by independent direct current bias current sources 301 and 302, respectively. At this device, superconducting weak links 2 and 3, which are in series of two, are formed between superconducting electrodes 102 and 103 according to the form of a superconductor 110. Similarly, superconducting weak links 4 and 5, which are in series of two, are formed between superconducting electrodes 101 and 104. Since the mutual distance among superconducting electrodes 101, 102, 103, 104 differs depending on the form of a superconductor 110, the link between superconducting weak links 2 and 4, and between 3 and 5 is extremely small compared to the link between superconducting weak links 2 and 3, and between 4 and 5. In this device, the following basic switching becomes possible. Superconducting weak links 2 and 3 are driven by current from the direct current bias current source 301. Superconducting current flows through superconducting weak links 2 and 3 when the current value is lower than the critical current, and the current also starts to flow through superconducting weak links 4 and 5 if they are driven at a current greater than the critical current. Accordingly, it becomes possible to also shift a superconducting weak link 5 to a voltage state through a current which is generated as a result of superconducting weak links 2 and 3 turning into a voltage state by passing a current which is slightly smaller than the critical current through superconducting weak links 4 and 5 from the direct current bias current source 302. It was possible to control the shifting of superconducting weak links 2, 3 and 5 to a voltage state according to the value of current which is passed through an electrode 2 after cooling the device fabricated from fabricating process and materials similar to the first embodiment of the present invention by putting them into liquid helium and running it.

Figure 7:
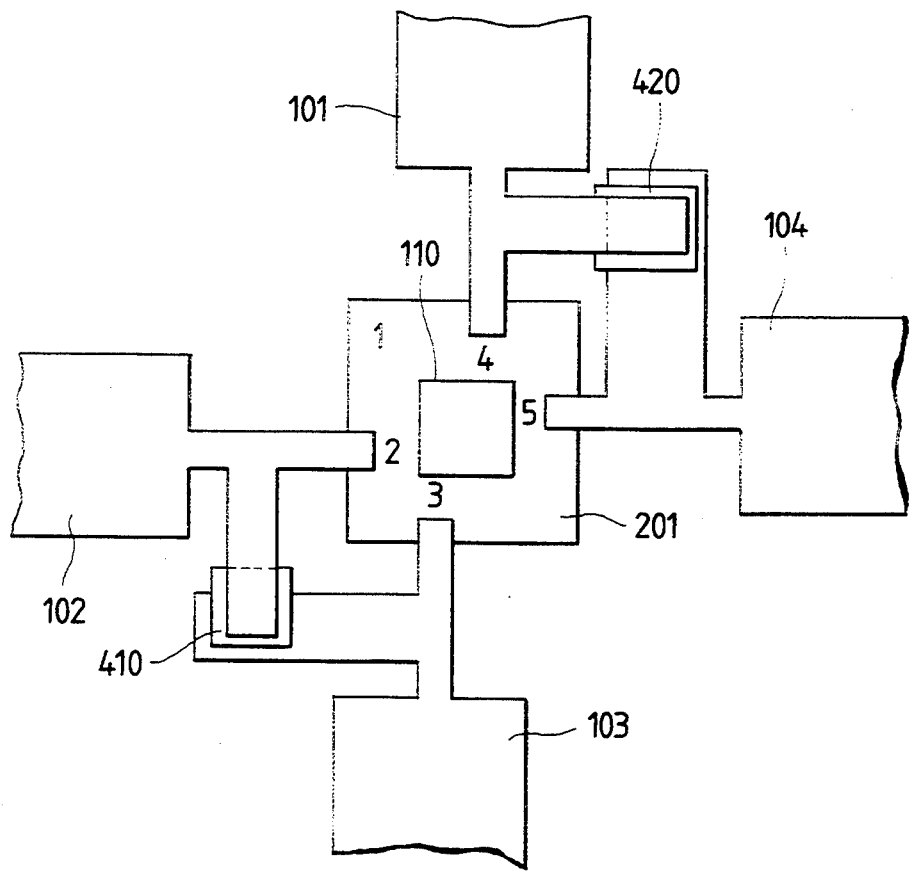
FIG. 7 is a top view of a superconducting device according to the fourth embodiment of the present invention.
Figure 8:
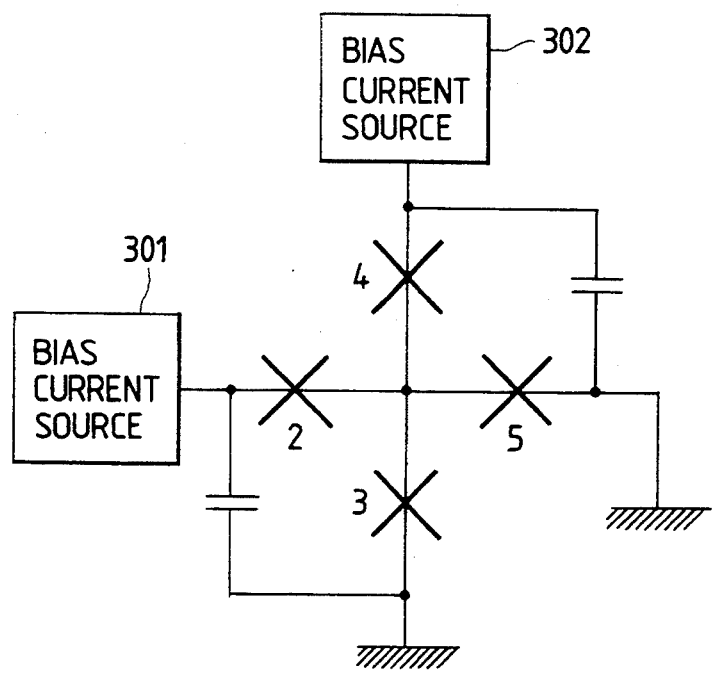
FIG. 8 is an equivalent circuit diagram of a superconducting device according to the fourth embodiment of the present invention.

Next, the fourth embodiment of the present invention will be explained in reference to FIG. 7. The fabricating process and materials used in the superconducting device of this embodiment can be same as those in the first embodiment of the present invention. In this embodiment, however, the difference is that a capacitive load is added between superconducting electrodes 102 and 103, and between 101 and 104 in the foregoing third embodiment. Superconducting electrodes 101 and 102 are installed to independently inject bias current. Superconducting electrodes 102 and 103, as well as 101 and 104 are separated by a 50 nm thick insulator layer formed by $Si_3N_4$, for instance, which is accumulated by a chemical vapor deposition so that they will function as condensers. An equivalent circuit diagram of this device is shown in FIG. 8. First, current values $I_1$ and $I_2$, which are obtained by multiplying the critical current of weak link by 0.9, are passed through superconducting electrodes 1 and 2. Then, superconducting weak links 2 and 3 shift to a voltage state when the value of $I_1$ is made greater than the critical current of weak link. At this time, an AC-load-current flows through because of a condenser 410 which is a capacitive load. Further, raising the value of $I_1$ will increase the amplitude of AC current, and AC current will also start to flow through a superconducting weak link 5. When the value of this amplitude becomes greater than 0.1 times the critical current of weak link, a weak link 5 also shifts to a voltage state. It was possible to control the shifting of superconducting weak links 2, 3 and 5 to a voltage state according to the value of current which is passed through an electrode 102 after cooling the device fabricated from a fabricating process and materials similar to the first embodiment of the present invention by putting them into liquid helium and running it.

Figure 9:
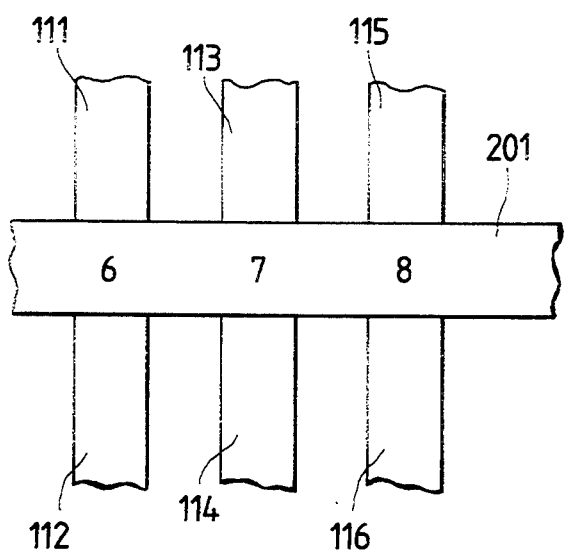
FIG. 9 is a top view of a superconducting device according to the fifth embodiment of the present invention.

Next, the fifth embodiment of the present invention will be explained in reference to FIG. 9. The fabricating process and materials of the superconducting device in this embodiment can be similar to those of the first embodiment of the present invention. The difference, however, is that, while two pairs of superconducting electrodes facing each other were arranged vertical to each other in the foregoing first embodiment, three pairs of superconducting electrodes facing each other are arranged parallel to each other in the embodiment of FIG. 9.

Figure 10:
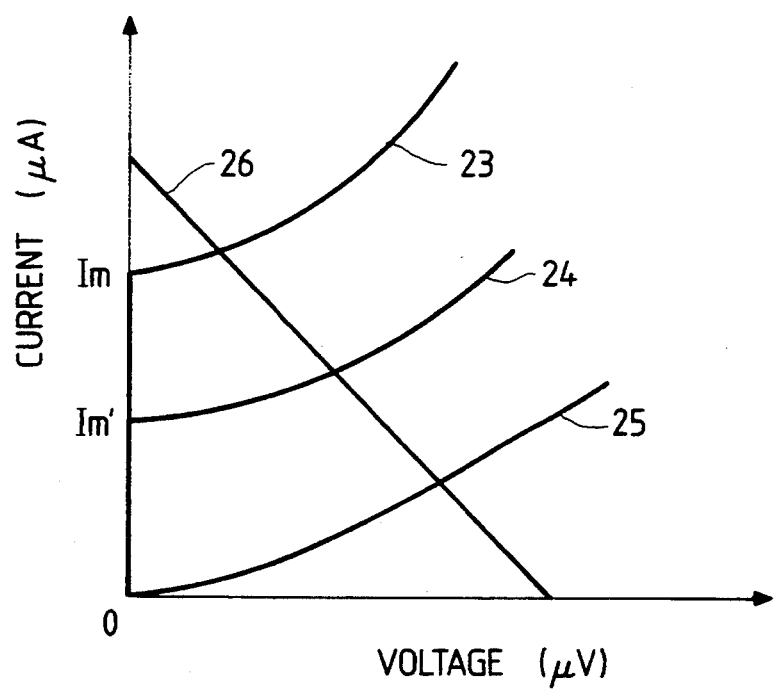
FIG. 10 are current-voltage characteristic curves (23, 24, 25 showing switching trajectory (26) of a superconducting device according to the fifth embodiment of the present invention.

This device is capable of performing the following basic function. A superconducting weak link 7 is linked as a result of an overlap in superconducting wave function that diffused from superconducting electrodes 113 and 114 and this link is controlled by quasi-particles that are injected into an adjoining superconducting weak link. Current-voltage characteristics of this embodiment are shown in FIG. 10. A current-voltage characteristic of an ordinary weak link 23 is shown if quasi-particles are not injected to either superconducting electrodes 111 or 115. Incidentally, passing a current greater than the critical current of weak link to either of the adjoining superconducting electrodes 111 or 115 will reduce the value of critical current at a weak link 115 as overlap in superconducting wave function at a weak link 115 will become smaller. As a result, the current-voltage characteristic will be as shown in 24. Further, passing a current greater than the critical current of weak link to both of adjoining superconducting electrodes 111 or 115 will result in current-voltage characteristic as shown in 25 as overlap in superconducting wave function at a weak link 115 will be eliminated. After cooling the device fabricated from fabricating process and materials similar to the first embodiment of the present invention by putting them into liquid helium, it was possible to run the shifting among the state characterized by a characteristic curve 23, the state characterized by a characteristic curve 24 and the state characterized by a characteristic curve 25 in the foregoing current-voltage characteristic by changing the value of the current which is passed through adjoining superconducting electrodes.

The basic function as described in the foregoing can be realized by controlling the critical current value of a superconducting weak link 7 through a magnetic field which is generated by passing an electric current through a control line which is installed parallel to superconducting electrodes 113 and 114. A modulation in critical current value of a similar superconducting weak link can be realized by installing a wave guide for laser irradiation and an irradiating microwave or laser. Thus, a basic function similar to the fifth embodiment in the present invention can be performed as the current-voltage characteristic of a superconducting weak link 7 will be as shown in the foregoing characteristic curve 24 owing to the influence from magnetic field, microwave and laser.

Figure 11:
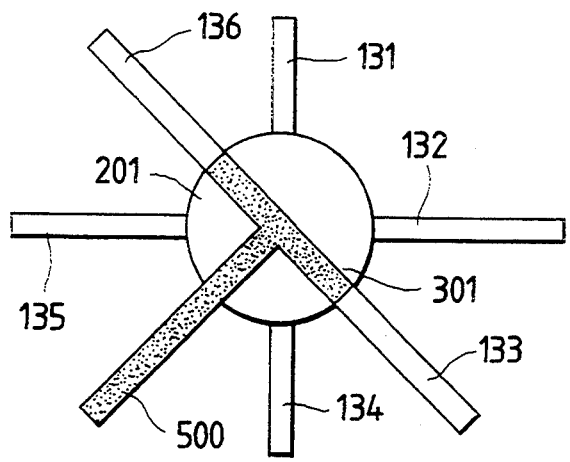
FIG. 11 a top view of a superconducting device according to the sixth embodiment of the present invention.

Next, the sixth embodiment of the present invention will be explained in reference to FIG. 11. The fabricating process and materials of the superconducting device in this embodiment can be similar to those of the first embodiment of the present invention. The difference, however, is that, while plural pairs of superconducting electrodes facing each other were adjoining a square or rectangular normal conductor in the foregoing first or fifth embodiment, six superconducting electrodes 131 through 136 are connected to a circle normal conductor in this embodiment. Further, a control electrode 500 is formed along a link path of a superconducting weak link which is formed on top of a normal conductor by superconducting electrodes 133 and 136. This device is capable of performing the following basic function. Although link path between any superconducting electrodes facing each other on a circumference will have equal coupling strength of link when voltage is not applied to a control electrode, application of voltage on a control electrode will change the local spatial variation in superconducting wave function of a normal conductor, with the coupling strength in link between superconducting electrodes 133 and 136 increasing the coupling strength of link between other superconducting electrodes.

Figure 12:
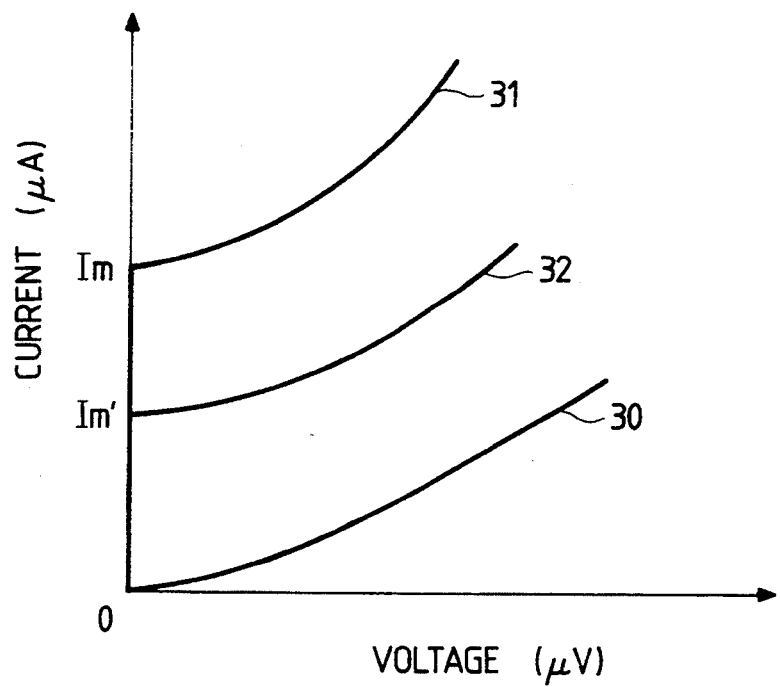
FIG. 12 is a current-voltage characteristic curves (30, 31, 32) of a superconducting device according to the sixth embodiment of the present invention.

A current-voltage characteristic of this embodiment is shown in FIG. 12. Current-voltage characteristic will be as shown in curve 30 when voltage is not applied to the control electrode. All pairs of superconducting electrodes that are facing each other on a circumference of a normal conductor will show such current-voltage characteristic. Since the coupling strength of link between superconducting electrodes 133 and 136 will increase when voltage is applied to the control electrode, the current-voltage characteristic between these electrodes will be as shown in curve 31. At this time, the current-voltage characteristic between electrodes without a control electrode will remain as shown in curve 30. Meanwhile, the current-voltage characteristic among superconducting electrodes 131, 133 and 136 will be as shown in curve 32 as it is influenced by control electrode voltage halfway through the path. Such changes in current-voltage characteristic were obtained by putting the superconducting device that was fabricated, into helium for cooling and applying voltage on the control electrode.

Next, the seventh embodiment of the present invention will be explained in reference to by using FIG. 13 and FIG. 14. The fabricating process and materials of the superconducting device in this embodiment can be similar to those of the sixth embodiment of the present invention. The difference, however, is that, while a control electrode is installed on top of a normal conductor in the foregoing sixth embodiment, a control electrode is not installed on top of a normal conductor in this embodiment.

Figure 13:
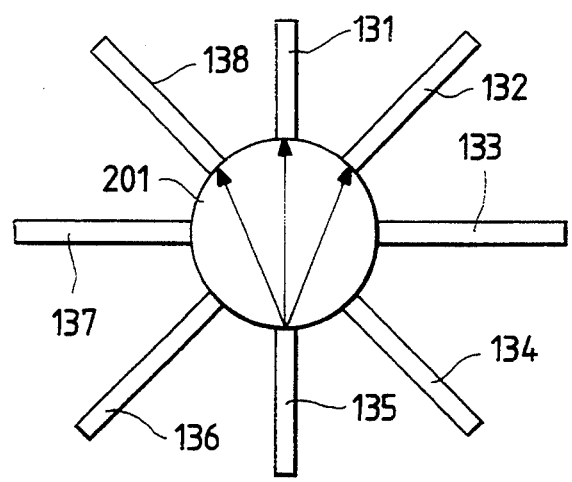
FIG. 13 is a top view of a superconducting device according to the seventh embodiment of the superconducting device of the present invention.
Figure 14:
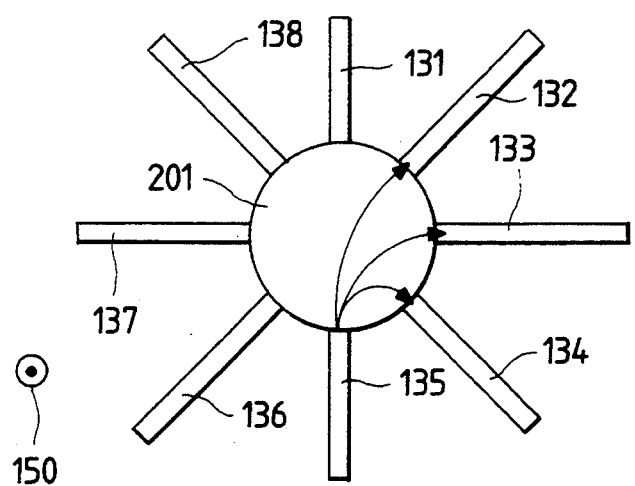
FIG. 14 is an equivalent circuit diagram of a superconducting device according to the seventh embodiment of the present invention.

In this superconducting device, Andreev reflection occurs at a path shown in FIG. 13. Therefore, an electron injected from a superconducting device, 135, for instance, is reflected as a hole at superconducting electrodes 131, 132 and 138. This phenomenon is observed as an excess current which is manifested in current-voltage characteristic of superconducting electrodes 135 and 131, 132 or 138. After applying a magnetic field to this superconducting device, the path of an injected electron will change and an excess current is no longer observed between superconducting devices 143 and 147 as shown in the diagram. However, an Andreev reflection occurs between superconducting electrodes 135 and 133. In addition, it becomes possible to switch the path at which Andreev reflection occurs between 135 and 132, or between 135 and 134, as shown in FIG. 14. Therefore, it has been found that the path at which Andreev reflection occurs can be switched by modulating the strength of the magnetic field in a superconducting device equipped with a foregoing structure. Such operation was obtained by putting the superconducting device that was fabricated into helium for cooling and applying a magnetic field on the superconducting device.

Figure 15:
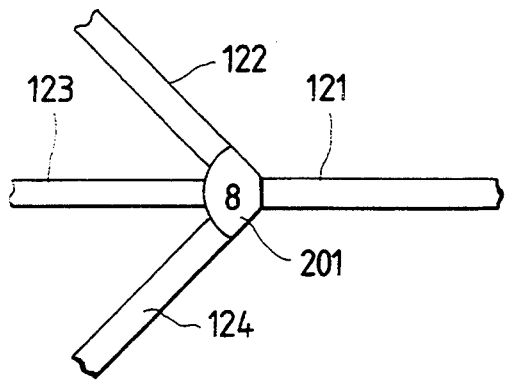
FIG. 15 is a top view of a superconducting device according to the eighth embodiment of the present invention.

Next, the eighth embodiment of the present invention will be explained in reference to FIG. 15. The fabricating process and materials of the superconducting device in this embodiment can be similar to those of the first embodiment of the present invention. The difference, however, is that, while plural pairs of superconducting electrodes facing each other were adjoining a square or rectangular normal conductor in the foregoing first or fifth embodiment, a superconducting weak link equipped with plural input-output terminals is formed by three superconducting electrodes that are facing each other with a fan-shaped normal conductor that has the tip of a superconducting electrode 121 as the center in this embodiment. In the device shown in this diagram, superconducting electrodes 122, 123 and 124 are used as input terminals, and superconducting electrode 121 is used as an output terminal. This device can be run as a neuron device in the following manner. The currents that enter superconducting electrodes 122, 123 and 124, which are input terminals, shall be identified as $i_2$, $i_3$ and $i_4$, respectively. Assuming that the critical current of this weak link is $i_m$, superconducting weak link shifts to a voltage state once the following condition $i_2 + i_3 + i_4\ i_m$ is satisfied. This voltage state can correspond to the excitement state of a neuron device. When the superconducting device that can be used as a single neuron device manufactured in this manner was run after putting it inside liquid helium for cooling, it was possible to control weak link voltage state through a value of current which is injected into superconducting electrodes 122, 123 and 124.

Figure 16:
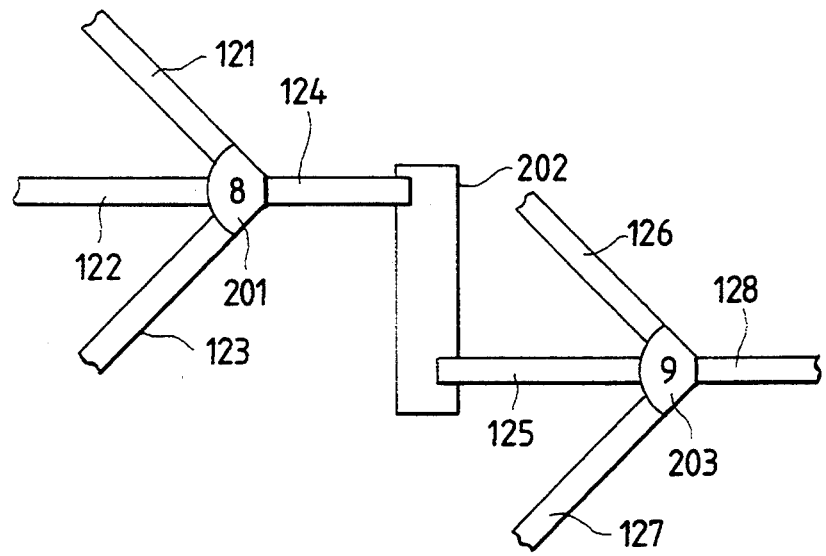
FIG. 16 is an equivalent circuit diagram of a superconducting device according to the fourth embodiment of the present invention.
Figure 17:
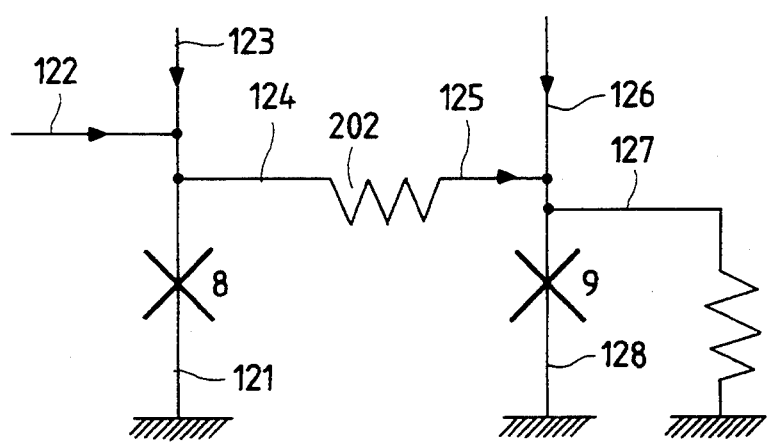
FIG. 17 is an equivalent circuit diagram of a superconducting device according to the eighth embodiment of the present invention.

Next, the eighth embodiment in the present invention will be explained in reference to FIG. 16. The fabricating process and materials of the superconducting device in this embodiment can be similar to those of the first embodiment of the present invention. The difference, however, is that, in this embodiment, the superconducting device in the foregoing sixth embodiment which can be run as a neural device is integrated. Thus, as the superconducting device according to the present invention is a multiterminal device formed on the same plane, it is easy to integrate and very easy to form a neural network. FIG. 17 is an equivalent circuit diagram of a superconducting device according to this embodiment.

The switching motion of the neural device is explained by using this diagram.

(i) If the sum of current that enters superconducting weak links 8 and 9 (input signal) does not exceed the critical current of a weak link 8, all current will flow through weak link. Therefore, weak links 8 and 9 will maintain a superconducting state.

(ii) If the sum of current that enters a superconducting weak link 8 does exceed the critical current of a weak link 9, a weak link 8 will shift to voltage state and current Ie will flow to a weak link 9 through a load resistance.

(iii) If the total current that is input to a weak link 9 from current Ie and other terminal does not exceed the critical current of a weak link 9 in the case of (ii), a weak link 8 will be in a voltage state but a weak link 9 will be in a superconducting state.

(iv) If the total current that is input to a weak link 9 from current Ie and other terminal does exceed the critical current of a weak link 9 in the case of (ii), both weak links 8 and 9 will be in a voltage state. When the superconducting device that can be used as a neuron device fabricated in this manner was run after putting it inside liquid helium for cooling, it was possible to control each voltage state independently through value of current which is injected into superconducting electrodes 122, 123 and 124 and also convey the voltage state (excitement state). While Nb was used as a superconductor in the foregoing embodiments, it goes without saying that Pb or Pb alloy as well as intermetallic compounds of Nb, such as NbN, Nb$_3$Sn, Nb$_3$Ge, Nb$_3$Al, Nb$_3$Si can also be used as a substitute. Furthermore, while Al was used as a normal conductor, it goes without saying that the object of the present invention of this application can also be achieved by using Au, Ag, Cu or semiconductors and semiconductor compounds, such as Si, GaAs and InAs.

In the present invention, a superconducting device suitable for high integration can be realized as it is capable of structuring a superconducting weak link equipped with plural superconducting electrodes that can be used as input-output terminals as well as changing the symmetry of a superconducting electrode arrangement according to the shape of normal conductors comprising the superconducting weak link. Moreover, when using this superconducting device as a quasi-particle injecting type device, a superconducting device which is capable of using plural superconducting electrodes as a gate electrode, drain electrode or control electrode will be realized. Furthermore, by utilizing these characteristics, a superconducting device which is capable of high integration and equipped with new functions (e.g. function as a neuron device) can be realized. In addition, being a proximity effect type, a superconducting weak link has an advantage of being able to realize a high-speed and low power consumption switching device.

In the foregoing descriptions and attached diagrams: reference numerals 101, 102, 103,104, 111, 112, 113, 114, 115, 116, 121, 122, 123, 124, 125, 126, 127, 128, 131, 132, 133, 134, 135, 136, 137, 138, 141, 142, 143, 144, 145, 146 and 147 designate superconducting electrodes (Nb); 1, 2, 3, 4, 5, 6, 7, 8 and 9 designate weak link sections; 301 and 302 designate direct current bias current sources; 410 and 420 condensers, 119 designates a silicon substrate; 120 designates a SiO2 layer; 201, 202, 203, 241 and 242 designate normal conductor layers (Al), 10, 23 and 30 designate current-voltage characteristic when control is not applied; 11, 24, 25, 31 and 32 designate current-voltage characteristic when control is applied; 12 and 25 designate load curves; 150 designates the direction of magnetic flux; and 500 designates a control electrode.

What is claimed is:

1. A superconducting device comprising:
   a substrate;
   an insulator film disposed on the substrate;
   a normal conductor layer disposed on the insulator film; and
   three superconducting electrodes formed in contact with the first normal conductor layer;
   wherein said at least three superconducting electrodes are disposed on the normal conductor layer and contact layer superconducting electrode is positioned substantially in an equal distance from a central point of said normal conductor layer and have substantially same form.

2. A superconducting device according to claim 1, wherein one of said three superconducting electrode is a control electrode.

3. A superconducting device according to claim 1, wherein said superconducting electrodes include materials selected from the group consisting of lead, lead alloy, niobium and niobium intermetallic compound.

4. A superconducting device according to claim 1, wherein said normal conductor includes at least one material selected from the group consisting of gold, silver, copper, aluminum, aluminum alloy, semiconductor, and semiconductor compounds such as Si, GaAs, InAS.

5. A superconducting device according to claim 1, wherein the width of the at least three superconducting electrodes are 2 to 0.5 μm.

6. A superconducting device according to claim 1, wherein the superconducting electrodes face toward the center point of the normal conductor layer.

* * * * *

UNITED STATES PATENT AND TRADEMARK OFFICE
CERTIFICATE OF CORRECTION

PATENT NO. : 5,442,195
DATED : August 15, 1995
INVENTOR(S) : Kazuo Saitoh, et al.

It is certified that error appears in the above-indentified patent and that said Letters Patent is hereby corrected as shown below:

| Column | Line | |
|--------|------|---|
| 1 | 16 | Change "Quitecron to --Quiteron--. |
| 2 | 24 | Change "cart" to --can--. |
| 2 | 66 | After "is" insert --an--. |
| 10 | 26 | Before "three" insert --at least--. |
| 10 | 30 | Change "contact layer" to --each--. |
| 10 | 32 | Change "central" to --center--. |

Signed and Sealed this

Twenty-eighth Day of November 1995

Attest:

BRUCE LEHMAN

Attesting Officer   Commissioner of Patents and Trademarks